United States Patent [19]

Wiesmann

[11] Patent Number: 4,532,470
[45] Date of Patent: Jul. 30, 1985

[54] READING SENSING METER

[75] Inventor: Thomas W. Wiesmann, Seattle, Wash.

[73] Assignee: John Fluke Mfg. Co., Inc., Everett, Wash.

[21] Appl. No.: 443,672

[22] Filed: Nov. 22, 1982

[51] Int. Cl.³ .................... G01R 19/00; G01R 17/06; H03K 5/20
[52] U.S. Cl. .................... 324/76 R; 324/99 D; 328/132
[58] Field of Search ............ 324/99 D, 76 R; 328/132; 179/DIG. 3; 307/152

[56] References Cited

U.S. PATENT DOCUMENTS 3,984,667  10/1976  Loshbough ............ 177/DIG. 3
4,008,405  2/1977   Neumann et al. ........ 328/132
4,158,809  6/1979   Dellamano ............. 328/132

Primary Examiner—Ernest F. Karlsen
Attorney, Agent, or Firm—Mikio Ishimaru; Stephen A. Becker

[57] ABSTRACT

A measuring instrument provides a reading only when a desired measurement is taken by making successive measurements and waiting until two successive measurements are within a predetermined low range, the measurements are above a predetermined floor range, and the difference between a reading and successive measurements exceed a predetermined high range.

18 Claims, 3 Drawing Figures

READING SENSING METER

FIELD OF THE INVENTION

The present invention relates to electronic meters which take a measurement reading and hold it for review.

BACKGROUND OF THE INVENTION

In the past, various instruments were developed for taking voltage and resistance measurement readings and providing their corresponding digital values on a numeric display. To use these instruments, it was necessry for an operator to visually locate the point at which the measurement was to be taken on a circuit, hold the probe of the instrument against the proper point, and look at the digital display on the meter while holding the probe against the proper point on the circuit. In practice, this procedure proved to be extremely fatiguing and error prone because the mere turning away to look at the instrument would often cause the probe to slip from the proper point.

One solution to this problem has been to provide a probe with a push button switch which would allow the operator to touch the desired point, activate the push button and thus hold the reading on the instrument. This allows the operator to devote full attention to the probe until the reading was complete. However, this approach requires a special probe and a number of components in the instrument which are costly extras when this feature is not desired. An approach has long been desired which would allow an instrument to sense when a reading is being taken and to tell the operator when the reading is complete. Heretofore, no method has been developed for achieving this result.

With the availability of inexpensive speech providing integrated circuit chips, it would be desireable to implement a talking instrument which would tell the operator when a reading has been made. At present, the only approach without a push button probe would be to have the instrument talk to provide all the readings which appear on the display. However, this would be very distracting to an operator and may lead to mistakes in taking the readings since the instrument will be taking continuously.

This speech ability would primarily augment the display.

SUMMARY

The present invention provides an instrument which will provide an operator with an indication of when a reading has been completed.

The present invention further provides an instrument which provides an indication when a reading is complete by determining when two successive readings are within predetermined values of each other and the readings are above a predetermined minimum value. And to assure that another indication will not be provided until two successive readings exceed each other by a predetermined amount.

The present invention further provides an instrument which will hold a reading and provide an audio signal when a reading is complete.

The present invention further provides an instrument which will tell an operator the value of the reading when a reading is complete.

The above and additional advantages of the present invention will become apparent to those skilled in the art from a reading of the following detailed description when taken in conjunction with the accompanying drawings.

Figure 1:
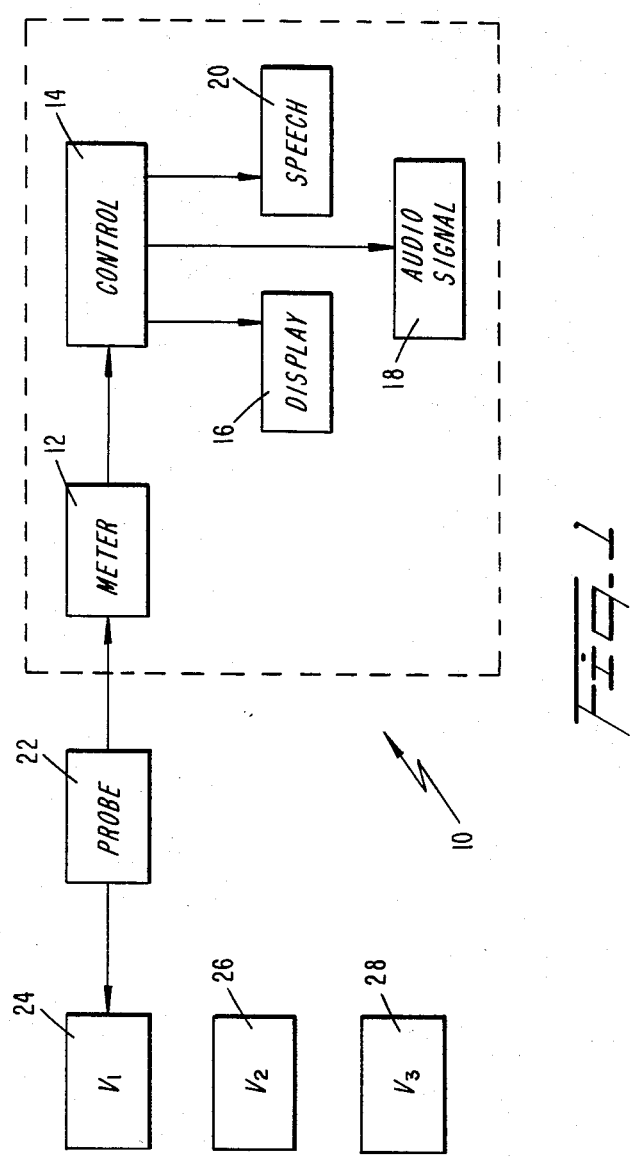
FIG. 1 is a block diagram of the present invention set up for voltage testing.

DESCRIPTION OF THE PREFERRED EMBODIMENTS:

Referring now to FIG. 1, therein is shown an instrument 10 which incorporates one embodiment of the present invention. The instrument 10 consists of a conventional meter 12 for taking conventional value readings, such as for voltage, current, and/or resistance. The meter 12 takes the analog signals provided thereto and converts them to digital signals for display by various well-known A/D conversion techniques. The meter 12 is connected to a control 14 which could be any conventional programmable microprocessor. The control 14 is selectively connectable to conventional display circuitry 16 and is connected to conventional audio signal circuitry 18. The control 14 is further connectable to speech synthesizer circuitry 20.

As shown in FIG. 1, the meter components 12 and the instrument 10 are connected to a probe 22 which is brought into contact with differing voltages, for example, designated as $v_1$, $v_2$, and $v_3$ in blocks 24, 26 and 28, respectively.

Figure 2:
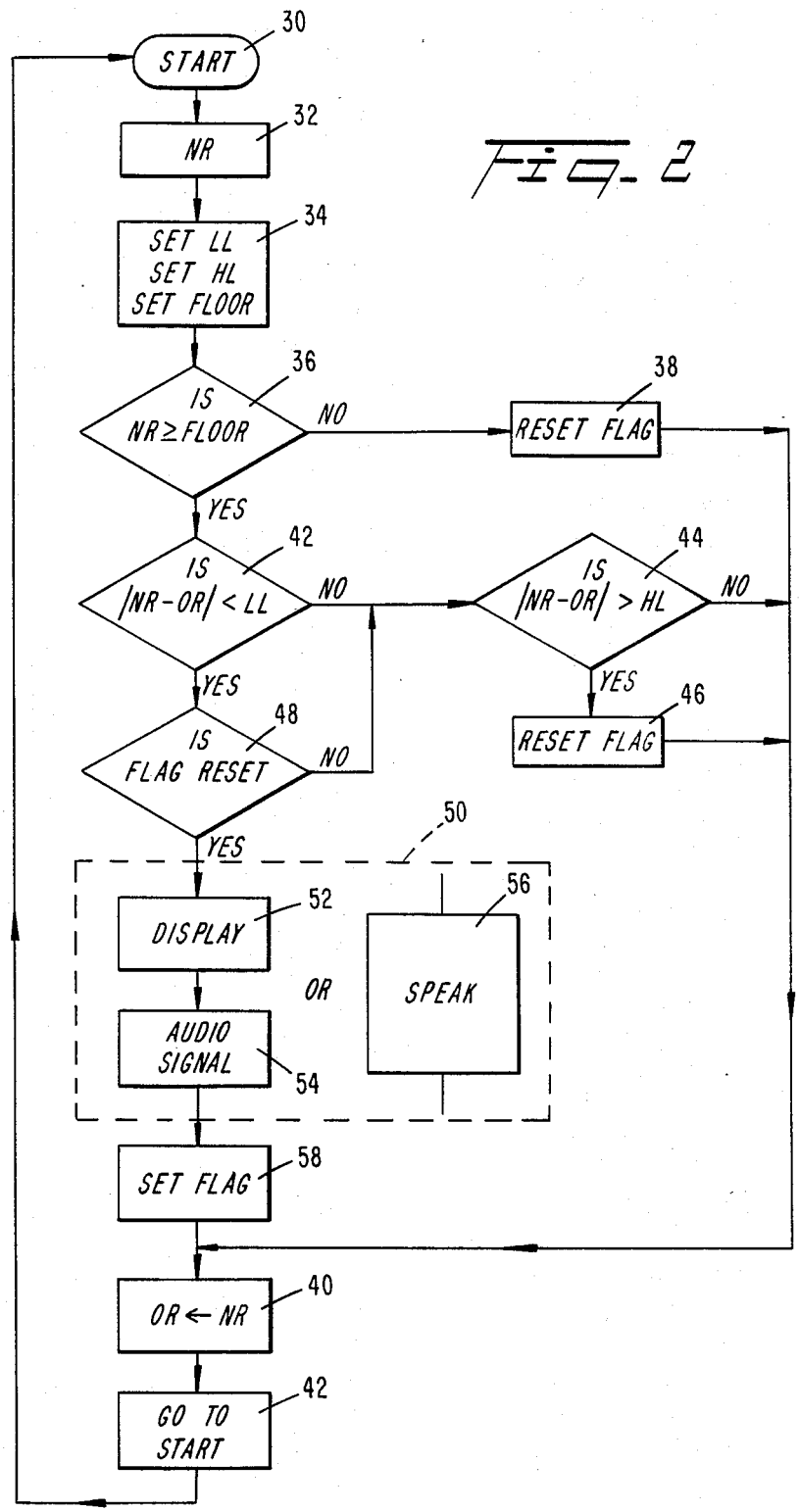
FIG. 2 is a block diagram of a program utilized in the microprocessor of one embodiment of the present invention.

Referring now to FIG. 2 therein is shown the program which would be utilized in the programmable microprocessor which makes up the control 14. The program starts at start block 30 and proceeds to the new reading (NR) block 32 where the new A/D reading is taken.

From the NR block 32, the program proceeds to set block 34 in which the low limit (LL) for determining closeness, the high limit (HL) used for hysteresis, and the zero range (floor) values are set. These values are heuristically determined to minimize noise effects.

From the set block 34 the program proceeds to a decision block 36 where it is determined whether or not the new reading is equal to or greater than the floor value.

If the new value is not greater than or equal to the floor value, the program proceeds to reset flag block 38 where an indicator value, or flag, is reset. The program then proceeds to the replacement block 40 where the old A/D reading (OR) is replaced by the new A/D reading.

If the new reading is equal to or greater than the floor, the program proceeds to decision block 42 to determine if the difference between the new reading and the old reading is less than the predetermined low limit.

If the absolute value between the new reading and the old reading is not less than the low limit, the program proceeds to decision block 44 where it is determined whether or not the absolute value of the difference between the new reading and the old reading is greater than the high limit. If it is not, the program proceeds to the replacement block 40; if it is, the progrm proceeds to reset flag block 46 where an indicator is reset as with reset flag block 38.

If the absolute value of the difference between the new reading and the old reading is less than the low limit, the program proceeds to decision block 48 to determine whether or not the flag has been reset by having the program implement reset flag blocks 38 or 46. If it has not, the program proceeds to the decision block 44 as previously described.

If the flag has been reset, the program proceeds to end of test signal block 50.

In the block 50 either or both of two systems may be implemented. The first provides a display on display circuitry 16 and audio signal on circuitry 18 by means of a display block 52 and an audio signal block 54. As an alternative, the decision block 48 could be connected to a speak block 56 which would cause the meter to talk via the speech synthesizer circuitry 20.

The signal block 50 is connected to a set flag block 58 which the first time through will set flag indicator. The set flag block 58 is connected to the replacement block 40.

From the replacement block 40, the program will proceed to go to start block 42 which will return the program to the start block 30.

Figure 3:
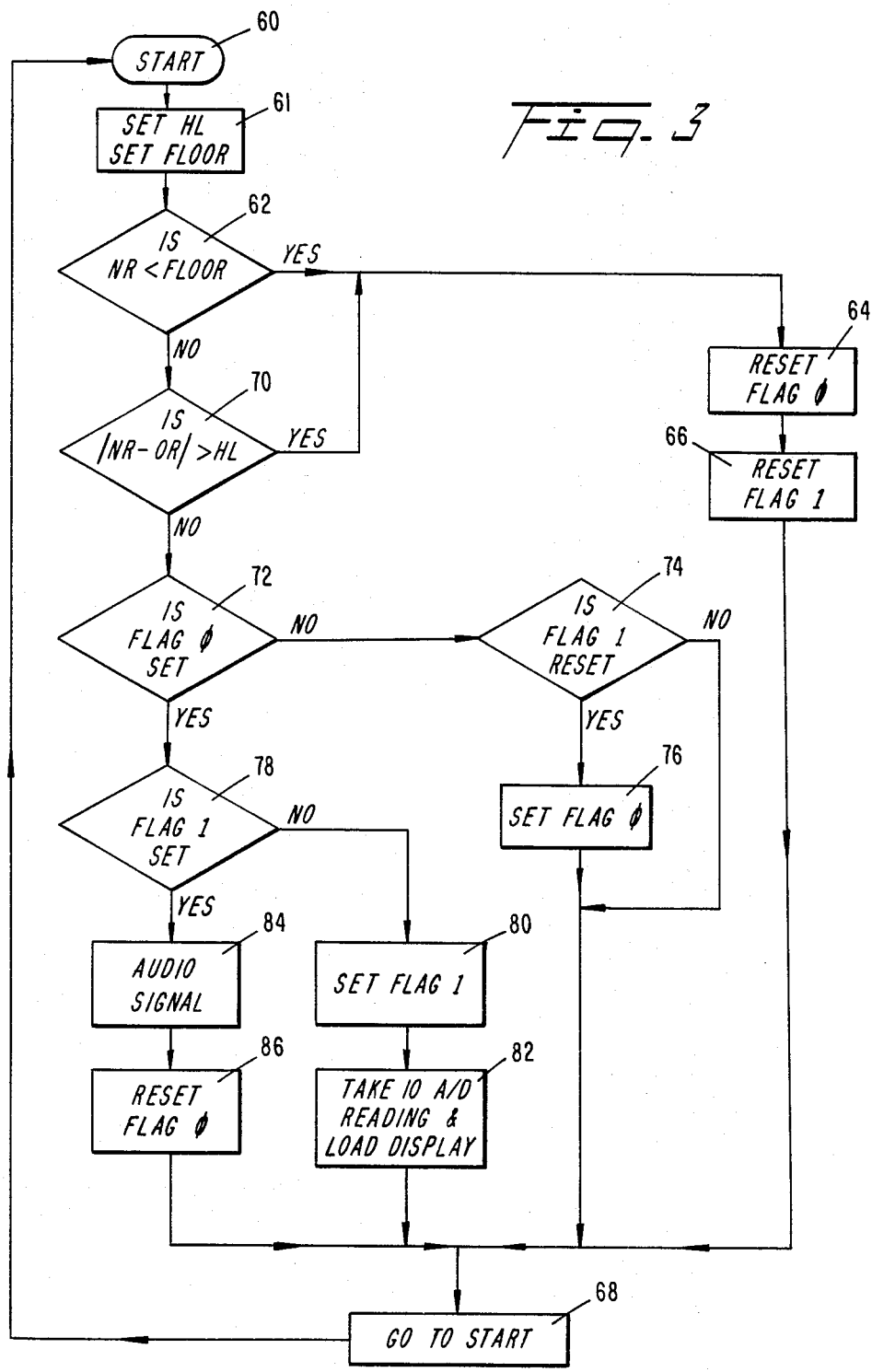
FIG. 3 is a block diagram of the program utilized in a microprocessor of an alternate embodiment of the present invention.

Referring now to FIG. 3, therein is shown an alternate embodiment of the present invention which is utilized with meter 12 which provides a dual conversion scheme in which a number of A/D conversions are performed to provide one set of minor readings and an average is taken over a predetermined number of these minor readings to provides a major reading. As shown in FIG. 3, the program starts at start block 60 and proceeds to set block 61 which set the high limit and floor surface proceeding to a decision block 62 where it is determined if the new reading is less than the floor value.

If the new reading is less than the floor value, the program proceeds to reset flag zero block 64 and thence to reset flag 1 block 66 to respectively reset two indicators. The program then proceeds to the go to start block 68 for the program to return to the start 60.

If the new reading is not less than the floor, the program proceeds to the decision block 70 to determine if the absolute value between the new reading and the old reading is greater than the high limit. If it is, the program proceeds to the reset flag zero block 64; if it is not, the program proceeds to decision block 72 to determine if the flag zero has been set. From the decision block 72, if the flag zero has not been set the program proceeds to decision block 74 to determine if flag one has been set. If flag one has not been reset the program proceeds to go to start block 68; if the flag one has been reset, the program will proceed to set flag zero block 76 before proceeding to the go to start block 68.

If it is determined at the decision block 72 that the flag zero is set, the program will proceed to decision block 78 to determine if flag one has been set. If flag one is not set, the program will proceed to set flag one block 80 to set the first indicator and then will proceed to display block 82 where the control 14 will take ten A/D readings and load the display. From the display block 82, the program then proceed to the go to start block 68.

If the flag one is set, the program will proceed from decision block 78 to block 84 where an audio signal will be provided. From the signal block 84 the program will then proceed to reset block 86 where the program will reset the flag zero and then proceed to the go to start block 68.

Initially, the instrument 10 is brought into operation with the probe 22 not connected to any of the voltages and thus a zero voltage is inputted into the instrument 10. Starting at the start block 30 of FIG. 2, this new reading is entered at block 32 and the program progresses to set the low limit, the high limit, and the floor.

The low limit establishes how close together two sucessive readings must be before they'll be considered as a common reading. It essentially indicates when a particular series of values has stabilized. The higher limit provides the range of how far apart two successive readings must be before a new reading will be presumed. The floor provides the noise level at which a zero reading will still be considered to be zero.

At decision block 36 for a zero reading, the program will proceed to the block 36 where the flag is reset. The program will then start to loop around continuously with nothing more happening.

When the probe 22 is moved to the $v_1$ voltage block 24, the program will loop around to the decision block 36 where it will determined, for example, that the new reading is higher than the floor in which case the program will proceed to decision block 42. If it is determined in the decision block 42 the absolute value of the difference between the new reading and the old reading is greater than the lower limit, the program will proceed to the decision block 44 where it will be determined whether that difference is greater than the high limit. If it is not, the program will continue to loop around and if it is the program will proceed to block 46 where the flag will be reset if it hasn't previously been reset.

On each loop, the new reading will replace the old reading.

When the final value $v_1$ is reached, the absolute value between the new reading and the old reading will become less than the low limit so the program will proceed from the decision block 42 to the decision block 48 where since the flag will have been reset during previous loops, the program will proceed to either the load display block 52 and thence to the audio signal block 54 to provide a visual display followed by an audio tone or the instrument 10 will talk to give the verbal reading according to block 56. The program will then proceed to set the flag at block 58 and commence the new loop. The new loop will pass through the decision block 42 to the decision block 44 thence the end of the signal block will be avoided as long as the high limit is not exceeded. When the probe 22 is moved to $v_2$ which is higher than $v_1$ by more than the high level, the program will be diverted at the decision block 44 to be routed to the block 46 for the flag to be reset and the program will continue to loop with nothing happening until the new reading stabilizes and the decision block 42 causes the program to proceed to the decision block 48 and through the end of test signal block 50.

Thus, it is evident that no end of test signals will be provided as long as the voltages remain within a predetermined range of each other and the high limit is not exceeded.

The probe 22 is removed before connection to $v_3$ voltage block 28, the program will loop through to zero with the end of test signal block being avoided. Only with the connection to $v_3$ voltage block 28 and the stabilization of the readings therefrom, will the program again enter the end of test signal block 50.

In actual practice, this means that an operator needs to hold the probe against a given voltage only as long as necessary for an accurate reading to be taken and then he will be informed that a reading is being held on a display indicative of the voltage or the instrument 10 will provide an audible reading of the voltage being tested. Inadvertent contacts will not provide a reading nor will noise. Further, no reading will be indicated just because an operator removes the probe 22 from a voltage.

An alternate embodiment of the present invention has the programmable microprocessor of the control 14 utilizing the program of FIG. 3.

Upon startup, the program starts at block 60 and proceeds to the decision block 62 where, for zero, it will be determined that the new reading is less than the floor and thus the program will proceed to block 64 and 66 where the flags zero and one will be respectively reset. The program will continue to loop around until the probe 22 is connected to voltage $v_1$ at which time the decision block 62 will determine that the new reading is no longer less than the floor reading and will cause the program to proceed to the decision block 70. In the decision block 70, the processor will determine the absolute value between the new reading and the old reading and then will determine whether or not it is greater than the higher limit. If this absolute value is greater than the high limit, the program will proceed to reset flag zero and one block 64 and 66, respectively. If this absolute value is not greater than the high limit, the program will proceed to decision block 72 to determine if the flag zero has been set. If it has not been set, the program will proceed to decision block 74 to determine if flag one has been reset.

In the decision block 74, if the flag one had not been reset, the program will return to start 60 via block 68. If flage one has been reset, the program will proceed to set flag zero block 76 to set flag zero.

Returning now to decision block 72, if the flag zero has ben set, the program will proceed to decision block 78 determine if flag one has been set. If flag one has not been set the program will go to set flag one block 80 to set flag one and then will proceed to reading and display block 82 where the processor will take a predetermined number of analog to digital readings and display the average reading before returning to go to start block 68.

In decision block 78, if the flag one has been set the program will proceed to audio signal block 84 which could cause the meter to provide either a simple audio signal or will provide a speech readout of the digital reading in the display. After the audio signal has been provided the program will proceed to the reset flag zero block 80 to reset the flag zero and then will proceed to go to start block 68.

From go to start block 68 the program returns to start block 60 to reiterate.

As many possible embodiments may be made of the invention without departing from the scope thereof, it is to be understood that all matters set forth herein are set forth in the accompanying drawings is to be interpreted in an illustrative and not a limiting sense.

I claim:

1. An instrument comprising:
   meter means for measuring signals provided thereto and providing readings representative thereof; and
   control means responsive to said meter means for controlling said readings, said control means including means for storing successive first and second readings; means for determining a difference between said successive readings; means for establishing a reference low limit value and a reference high limit value; means for comparing said difference with said reference values; means for providing an output reading representative of the second reading when said difference is less than said reference low limit value; and means for updating the first reading when said difference is greater than said reference high limit value.

2. The instrument as claimed in claim 1 wherein said control means further includes means for establishing a reference floor limit, and means for comparing said successive readings to said floor limit and means responsive to two said successive readings below said floor limit to inhibit said output reading.

3. The instrument as claimed in claim 1 or 2 including visual display means connected to said control means responsive to said output to display a numerical value representative of the second of said two successive readings.

4. The instrument as claimed in claim 1 or 2 including speaking means connected to said control means responsive to said output to provide a the spoken indication representative of the second of said two successive readings.

5. A voltage measuring instrument comprising:
   a meter for measuring voltages provided thereto and outputting successive voltage measurement values;
   a probe connected to said meter for providing voltages thereto; and
   control means connected to said meter,
   said control means including means for retaining a first voltage measurement value from said meter, means for providing a measurement value difference representative of the difference between said first voltage measurement value and a second voltage measurement value, first comparing means for comparing the difference value with a reference low limit value,
   means responsive to said first comparing means for retaining said second voltage measurement value in place of said first voltage measurement value and for initiating an indication when said difference measurement value is less than the reference low limit value, and for processing said indication to control development of an output representative of said second voltage measurement value, second means for comparing said measurement value difference to a reference high limit value and means responsive to said first and second comparing means for updating said second voltage measuring value when said difference value is greater than said high limit value, and means for terminating said indication after said output has been provided.

6. The instrument as claimed in claim 5 wherein said control means includes third comparing means for comparing said first voltage measurement value to a reference floor limit value and means responsive to said third comparing means for initiating said indication when said first voltage measurement value is greater than said floor limit value.

7. The instrument as claimed in claim 5 or 6 including a visual display connected to said control means responsive to said output to display a numerical value representative of said second measurement value.

8. The instrument as claimed in claim 5 or 6 including a speech synthesizer connected to said control means responsive to said output to provide a spoken indication of said second measurement value.

9. A method of outputting readings from an instrument, comprising:
(a) taking successive readings with measuring means in said instrument;
(b) determining a difference between the successive readings;
(c) storing a most recent reading as an updated reading only when said difference is greater than a reference high limit value; and
(d) outputting the updated reading when a subsequent difference is within a reference low limit value.

10. The method as claimed in claim 9 including outputting said updated reading only when said most recent reading is above a reference floor value.

11. The method as claimed in claim 9 or 10 including providing a visual display representative of said most recent reading.

12. The method as claimed in claim 9 or 10 including providing an audio indication representative of said most recent reading.

13. A method of outputting voltage measurements from an instrument comprising:
(a) making a first voltage measurement;
(b) retaining a first voltage measurement value;
(c) setting a predetermined low limit value;
(d) making a second voltage measurement and retaining a second voltage measurement value;
(e) obtaining a first difference between said first and second voltage measurement values;
(f) retaining an indication when said first difference is above said low voltage value;
(g) replacing said first voltage measurement value with said second voltage measurement value;
(h) making a third voltage measurement and retaining a third voltage measurement value;
(i) obtaining a second difference between said second and third measurement values;
(j) providing an output representative of said third voltage measurement when said second difference is less than said low limit value and said indication has been retained;
(k) terminating said indication after providing said output; and
(l) replacing said second voltage measurement value with said third voltage measurement value.

14. The method as claimed in claim 13 including retaining said indication after each of said voltage measurements when said voltage measurements are less than a predetermined floor value.

15. The method as claimed in claim 13 including retaining said indication after each of said voltage measurements when the difference between subsequent measurements is greater than a predetermined high limit value.

16. A voltage measurement method, comprising the steps of
storing a predetermined high limit value;
making a first voltage measurement and retaining a first voltage measurement value;
making a second voltage measurement and retaining a second voltage measurement value;
obtaining a difference between said first and second voltage measurement values; and
if said difference is less than said high limit value, making a plurality of additional voltage measurements, obtaining an average voltage measurement value and supplying the average to an output.

17. The method as claimed in claim 16, 14 or 15 including displaying said third voltage measurement in numerical form on a visual display.

18. The method as claimed in claim 16, 14 or 15 including providing a spoken indication representative of said third voltage measurement.

* * * * *